United States Patent [19]

Joo

[11] Patent Number: 6,090,658
[45] Date of Patent: Jul. 18, 2000

[54] METHOD OF FORMING A CAPACITOR INCLUDING A BOTTOM SILICON DIFFUSION BARRIER LAYER AND A TOP OXYGEN DIFFUSION BARRIER LAYER

[75] Inventor: Jae Hyun Joo, Suwon-si, Rep. of Korea

[73] Assignee: LG Semicon Co., Ltd., Cheongju-si, Rep. of Korea

[21] Appl. No.: 08/911,374

[22] Filed: Aug. 7, 1997

[30] Foreign Application Priority Data

Dec. 3, 1996 [KR] Rep. of Korea .................. 96-61253

[51] Int. Cl.[7] ............................................. H01L 21/8242
[52] U.S. Cl. ............................. 438/240; 438/253; 438/653
[58] Field of Search .................................... 438/240, 253, 438/396, 652, 653

[56] References Cited

U.S. PATENT DOCUMENTS

| | | | |
|---|---|---|---|
| 5,005,102 | 4/1991 | Larson | 361/313 |
| 5,335,138 | 8/1994 | Sandhu et al. | 361/303 |
| 5,566,045 | 10/1996 | Summerfelt et al. | 361/321.1 |
| 5,793,600 | 8/1998 | Fukuda et al. | 361/321.4 |

Primary Examiner—Charles Bowers
Assistant Examiner—William M. Brewster
Attorney, Agent, or Firm—Fleshner & Kim, LLP

[57] ABSTRACT

Capacitor in a semiconductor device suitable for diffusion prevention between a lower electrode and a polysilicon and oxidation prevention of a barrier metal layer and a method for manufacturing the same are disclosed. The capacitor in a semiconductor device includes a semiconductor substrate, an insulating layer having a contact hole on the substrate, a plug formed in the contact hole, a first barrier layer on the plug, a second barrier layer on the first barrier layer, a lower electrode on the second barrier layer, a dielectric layer on the lower electrode, and an upper electrode on the dielectric layer.

9 Claims, 7 Drawing Sheets

LEGEND
concentration of silicon ----
concentration of oxygen ——

LEGEND concentration of silicon - - - -
concentration of oxygen ———

LEGEND
concentration of silicon ----
concentration of oxygen ———

LEGEND
concentration of silicon ----
concentration of oxygen ——

LEGEND
concentration of silicon ----
concentration of oxygen ——

METHOD OF FORMING A CAPACITOR INCLUDING A BOTTOM SILICON DIFFUSION BARRIER LAYER AND A TOP OXYGEN DIFFUSION BARRIER LAYER

BACKGROUND OF THE INVENTION

1. Field of the Invention

The present invention relates to a capacitor in semiconductor device. More particularly, the invention relates to a capacitor in a semiconductor device suitable for diffusion prevention between a lower electrode and a polysilicon in the capacitor and the oxidation prevention of a barrier metal layer. The invention yet further relates to a method for manufacturing the same.

2. Background of the Related Art

The higher a device packing density is, the less of an area available for a capacitor. Thus, the thickness of a dielectric layer is gradually decreased in order to compensate for the reduction of capacitance. However, the thinner a dielectric layer is, the greater the leakage current due to tunneling. As a result, the decrease in the thickness of the dielectric layer and the increase of leakage current generate problems, including the decrease of reproducibility and reliability.

In order to solve such a problem, a method has been commonly utilized in which a surface of very complicated roughness is formed in a storage node electrode to increase the effective area of the capacitor.

Moreover, stacked structures such as a nitride/oxide, oxide/nitride/oxide, etc., are used to keep with the trend of forming ultra thin films. However, in such a method, photolithography becomes difficult and thus the resulting process cost is increased due to the generation of a very significant coverage step. Accordingly, it is expected that this method cannot be used for manufacturing high integrated circuit devices of greater than 256 Mb DRAM.

Therefore, many methods have been proposed in which high dielectric constant materials are used as the dielectric film of a capacitor. Additionally, much research and development has been directed toward innovative improvement of capacitor capacity and the reduction of surface roughness.

$Ta_2O_5$ is one material in which much research and development interest has been directed due to its high dielectric constant. $Ta_2O_5$ has resulted in many improved characteristics, permitting a high packing density, and forming a very thin film. Nonetheless, the dielectric constant is actually not heightened. Thus, it is expected that the material will not be widely used due to the trend toward higher integration.

Recently, much attention has also been paid to use of a Perovskite type oxide in semiconductor devices because it also has a high dielectric constant.

PZT ($Pb(Zr,Ti)O_3$), PLZT (($Pb,La)(Zr,Ti)O_3$), BST (Ba, Sr)$TiO_3$), $BaTiO_3$, and $SrTiO_3$ are additionally high dielectric constant materials. However, these high dielectric constant materials have problems, most notably they easily react with silicon and polysilicon. Moreover, under strong oxidizing conditions their surfaces oxidize during formation of the high dielectric film. Thus, much research and development is currently being directed to improving electrode materials and electrode structure so as to obviate these types of problems. For example, a storage node constituting a lower electrode formed of platinum (Pt), which is hardly oxidized, restrains the generation of leakage current.

A conventional method for manufacturing a capacitor in a semiconductor device will be discussed with reference to the accompanying drawings.

FIGS. 1a to 1d show process steps of a conventional method for manufacturing a capacitor in a semiconductor device.

First, as shown in FIG. 1a, on a semiconductor substrate 1 in which an impurity diffusion region 2 is formed as a source/drain, there is formed an insulating layer 3. Then, the insulating layer 3 is selectively patterned by employing photolithography and photo etching so that a node contact hole 4 is formed on the impurity diffusion region 2.

Next, a polysilicon plug 5 is formed in the node contact hole 4, as shown in FIG. 1b. Subsequently, a TiW layer 6 and a lower electrode 7 are successively formed on the insulating layer 3 and the polysilicon plug 5 and then selectively patterned, so that only the TiW layer 6 and the lower electrode 7 used as a storage node are left. At this time, the lower electrode 7 is made of Pt, and the TiW layer 6, positioned between the lower electrode 7 and the polysilicon plug 5, is a barrier metal layer. If the Pt electrode used as the lower electrode 7 directly contacts the polysilicon plug 5, atoms of oxygen contained in a high dielectric layer formed on the lower electrode 7 contact atoms of silicon contained in the polysilicon plug 5, so that a silicon oxide layer ($SiO_2$) is formed at the interface. Thus, the TiW layer 6 is formed as a barrier metal layer in order to prevent a direct contact of the polysilicon plug 5 and the lower electrode 7. In reference, diffusion of silicon increases the inherent resistance of the lower electrode and makes a thin oxide film 11 formed over the lower electrode 7, resulting in the reduction of the dielectric constant.

Referring to FIG. 1c, sidewall spacers 8 are formed on both sides of the lower electrode 7 and the TiW layer by using an oxide. At this time, the sidewall spacers 8 are used to prevent the TiW layer 6 from acting as a path of leakage current generated by the contact of the TiW layer and the high dielectric layer which is formed next.

Referring to FIG. 1d, on the lower electrode 7 and the surface of the sidewall spacers 8, there is formed a high dielectric layer 9 of BST (($Ba,Sr)TiO_3$) on which an upper electrode 10, i.e. a plate node, is formed.

FIG. 2 is a profile diagram showing measurements of diffusion of silicon atoms by means of SIMS (secondary ion mass spectroscopy) when a TiW layer is used as the barrier metal layer. The silicon atoms contained in the polysilicon plug 5 are prevented from diffusing into the TiW layer, and the oxygen atoms contained in a high dielectric constant material such as BST cross the grain boundary of the Pt lower electrode and diffuse into the TiW layer 6 during deposition of the high dielectric material.

In a conventional semiconductor device capacitor, a TiW layer 6 is formed in the interface of a polysilicon plug 5 and a lower electrode so that silicon atoms contained in the polysilicon plug 5 may be effectively prevented from diffusing into the lower electrode 7. However, on forming the high dielectric layer 9 on the lower electrode 7 of Pt, oxygen atoms contained in the high dielectric layer 9 cross the grain boundary of the lower electrode 7 and directly react with the TiW layer 6 which is a barrier metal layer, such that a $TiO_2$ layer 11 is formed on the interface of the lower electrode 7 and the TiW layer 6. As a result, the contact of the lower electrode 7 and the TiW layer 6 is made unstable.

FIG. 3 is a cross-sectional view showing the structure of another conventional capacitor in a semiconductor device. The structure of the capacitor and the method thereof shown in FIG. 3 are quite similar to those shown in FIGS. 1a to 1d. However, there is one difference between the two. A TiN layer 12, not a TiW layer, is used as a barrier metal layer which is formed between a lower electrode 7 and a polysilicon plug 5. The purpose of forming the TiN layer 12 is the same as that of forming the TiW layer as described in FIG. 1c. It is formed to prevent the contact of silicon atoms contained in the polysilicon plug 5 and oxygen atoms contained in the high dielectric layer 9.

FIG. 4 is a profile diagram showing measurements of diffusion of silicon atoms by means of SIMS when a TiN layer is used as a barrier metal. It can be seen that oxygen atoms contained in a high dielectric layer which cross the grain boundary of the lower electrode 7 of Pt are prevented from diffusing to the TiN layer when the high dielectric layer made of, e.g., BST is formed on the lower electrode 7. Also, it can be seen that silicon atoms in the polysilicon plug 5 easily diffuse through the TiN layer 12, so that the oxygen atoms and the silicon atoms contact each other at the interface of the TiN layer 12 and the lower electrode 7.

In such a conventional capacitor in a semiconductor device, in order to effectively prevent oxygen atoms in the high dielectric layer from diffusing into the polysilicon plug, a TiN layer 12 is formed as a barrier metal layer in the interface. However, when the high dielectric layer 9 is formed on the lower electrode 7, the oxygen atoms of the high dielectric layer 9 diffuse through the grain boundary of the lower electrode 7 so to contact the Ti in the interface of the TiN layer 12 and the lower electrode 7, thus forming a $TiO_2$ layer. Or, silicon atoms in the polysilicon plug 5 formed below the TiN layer 12 diffuse by crossing the TiN layer 12 so as to contact the oxygen atoms diffusing inward from the high dielectric layer 9 to the upper portion of the TiN layer 12. Thus, a silicon oxide layer 13 is formed at the interface of the lower electrode 7 and the TiN layer 12.

That is to say, the TiN layer is more effective as a barrier metal layer against oxygen atoms of the high dielectric layer than a TiW layer. On the other hand, the TiW layer is more effective as a barrier against silicon atoms of the polysilicon plug than the TiN layer. Accordingly, the silicon atoms in the polysilicon plug 5, by crossing the TiN layer 12, diffuse to the interface of the lower electrode 7 and the TiN layer 12 and thus the TiN layer 12 can not prevent the formation of the silicon oxide ($SiO_2$) layer 13 which is formed by connection of the silicon atoms and the oxygen atoms. In such a case, the contact of the TiN layer 12 and the lower electrode 7 or the contact of the lower electrode 7 and the polysilicon plug 5 becomes unstable.

FIG. 5 is a cross-sectional view showing a conventional structure of still another capacitor in a semiconductor device.

The capacitor shown in FIG. 5 has a similar structure and a similar manufacturing method to those of the two previously described conventional ones. But there is, however, one difference. The difference is that a TaN layer 14, not a TiW layer or a TiN layer, is used as a barrier metal layer. It is known that the TaN layer 14 has an excellent oxidation prevention and an excellent oxygen diffusion prevention properties against oxygen atoms as compared to a TiW layer or a TiN layer, but that it has a poor silicon diffusion prevention properties against silicon atoms contained in the polysilicon plug 5, in comparison with the TiW layer.

FIG. 6 is a profile diagram showing measurements of diffusion of silicon atoms and oxygen atoms by means of SIMS when a TaN layer is used as a barrier metal layer. It is evident that, when a high dielectric layer 9 is deposited, oxygen atoms which have crossed the grain boundary of the lower electrode 7 of Pt are prevented from diffusing into the TaN layer 14. However, it is also evident that, when a high dielectric constant material, e.g. BST, is used as the high dielectric layer, the oxygen atoms crossing through the grain boundary of the platinum electrode used as the lower electrode 7 diffuse into the interface of the lower electrode 7 and the TaN layer 14 when the high dielectric layer 9 is formed. Additionally, the silicon atoms in the polysilicon plug 5 easily cross the TaN layer 14 by diffusion. As a result, the oxygen atoms and the silicon atoms contact one another at the interface of the TaN layer 14 and the lower electrode 7.

In the aforementioned example, in order to effectively prevent the oxygen atoms contained in the high dielectric layer 9 from diffusing to the polysilicon plug 5 by crossing the lower electrode 7, the TaN layer 14 is formed as a barrier metal layer. However in the process step of forming the high dielectric layer 9 on the lower electrode 7, the oxygen atoms contained in the high dielectric layer 9 cross the grain boundary of the lower electrode 7 and are present in the interface of the TaN layer 14 and the lower electrode 7. Also, the silicon atoms contained in the polysilicon plug 5 below the TaN layer 14 cross the TaN layer 14 by diffusion. As a result, the oxygen atoms and the silicon atoms are in the proximity of one another, thus forming a silicon oxide layer 13 in the interface of the lower electrode 7 and the TaN layer 14. Namely, the TaN layer 14 is more effective to be used as a barrier metal layer against the oxygen atoms contained in the high dielectric layer in comparison to a TiW layer or a TiN layer. On the other hand, the TaN layer 14 plays a poor role as a barrier metal layer against the silicon atoms contained in the polysilicon plug 5 in comparison with the TiW layer. As a result, the silicon atoms of the polysilicon plug 5 diffuse into the interface of the lower electrode 7 and the TaN layer 14, so that the formation of silicon oxide ($SiO_2$) layer 13 by reaction between the oxygen atoms and the silicon atoms cannot be prevented.

A conventional capacitor in a semiconductor device thus has many problems. In order to increase capacitance of the capacitor, a high dielectric constant material, e.g., BST (($Ba,Sr)TiO_3$) is formed on a lower electrode. In this case, decreased performance results if the lower electrode and a polysilicon plug directly contact each other. Thus, any one of a TaN layer, a TiW layer, and a TiN layer is formed as a barrier metal layer in the interface of the lower electrode and the polysilicon plug. Nonetheless, the TiW layer cannot effectively prevent the diffusion of oxygen atoms, and the TaN layer or the TiN layer cannot prevent the diffusion of silicon atoms. As a result, an oxide layer is formed in the interface of the barrier metal layer and the lower electrode, or the barrier metal layer is oxidized. Consequently, the inherent resistance of the capacitor is increased or its dielectric constant is decreased.

The above references are incorporated by reference herein where appropriate for appropriate teachings of additional or alternative details, features and/or technical background.

SUMMARY OF THE INVENTION

Therefore, the present invention is directed to a capacitor in a semiconductor device and a manufacturing method thereof that substantially obviates one or more of problems due to limitations and disadvantages of the related prior art.

An object of the invention is thus to provide a capacitor in a semiconductor device in which two or more barrier metal layers are formed for diffusion prevention of both silicon atoms and oxygen atoms and the resulting oxidation prevention of the barrier metal layers, and a manufacturing method thereof.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the capacitor in a semiconductor device includes: a semiconductor substrate; an insulating layer having a contract hole on the substrate; a plug formed in the contact hole; a first barrier layer on the plug, a second barrier layer on the first barrier layer, a lower electrode on the second barrier layer, a dielectric layer on the lower electrode, and an upper electrode on the dielectric layer.

In another aspect, there is provided a method for manufacturing a capacitor in semiconductor device including the steps of: forming an insulating layer on a semiconductor substrate and selectively etching the insulating layer to form a contact hole; forming a plug in the contact hole; successively forming a first barrier layer and a second barrier layer on the plug; forming a lower electrode on the second barrier layer; forming a dielectric layer on the lower electrode; and forming an upper electrode on the dielectric layer.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF PREFERRED EMBODIMENTS

Reference will now be made in detail to the preferred embodiments of the present invention, examples of which are illustrated in the accompanying drawings.

Figure 1A:
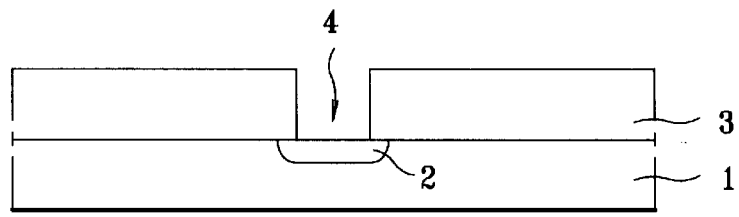
FIGS. 1a to 1d are cross-sectional views showing process steps of a method for a conventional capacitor in a semiconductor device.
Figure 1B:
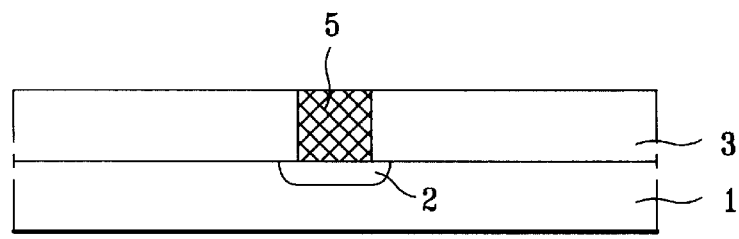
Figure 1C:
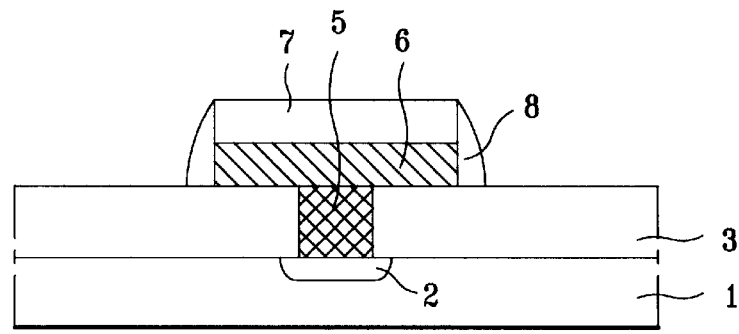
Figure 1D:
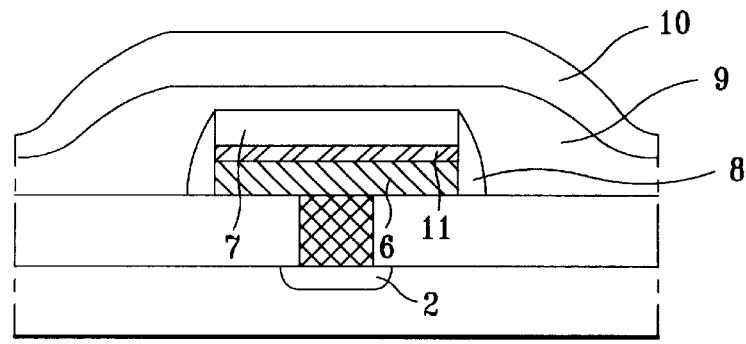
Figure 2:
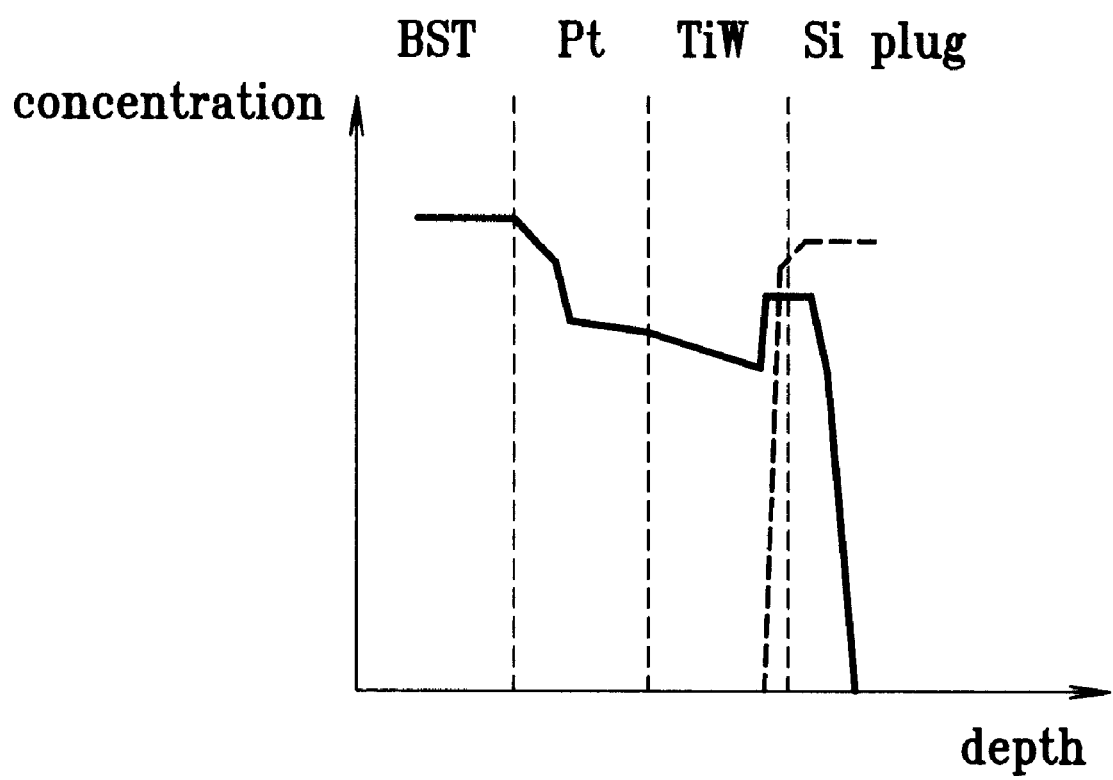
FIG. 2 is a profile diagram showing measurements of diffusion of oxygen atoms and silicon atoms by means of SIMS (secondary ion mass spectroscopy) when a TiW layer is used as a barrier metal layer.
Figure 3:
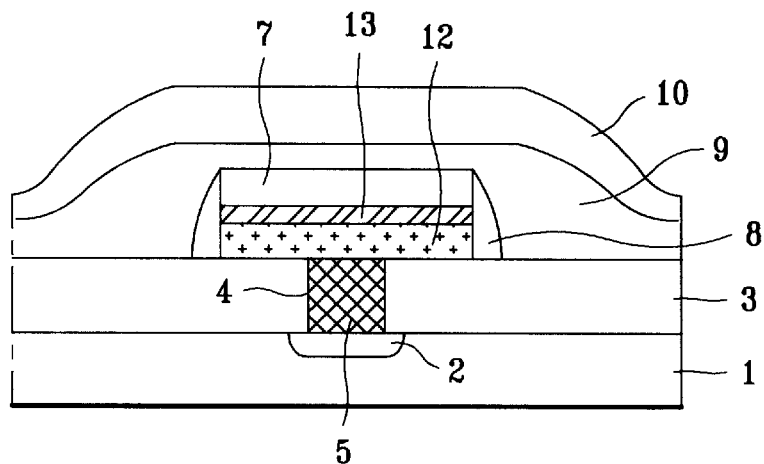
FIG. 3 is a ross-sectional view showing a structure of another conventional capacitor in a semiconductor device.
Figure 4:
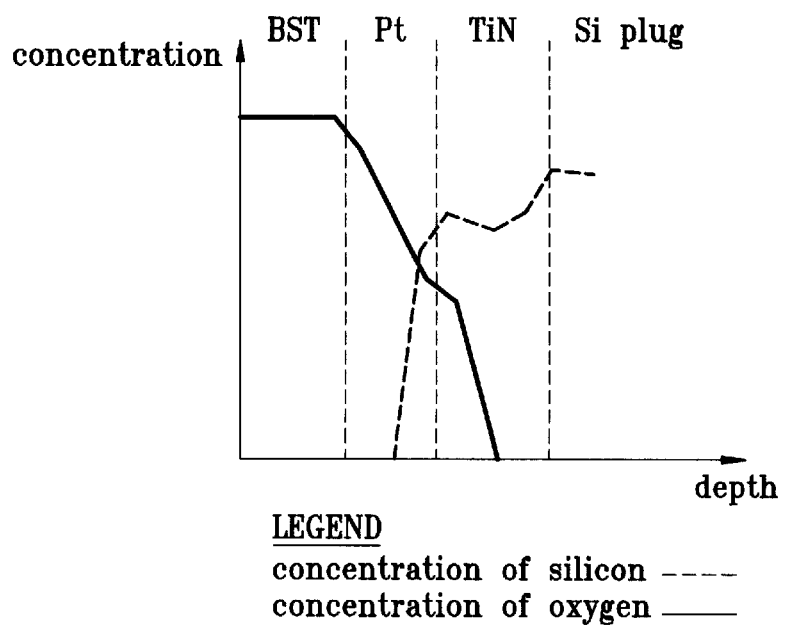
FIG. 4 is a profile diagram showing measurements of diffusion of oxygen atoms and silicon atoms by means of a SIMS when a TiN layer is used as a barrier metal layer.
Figure 5:
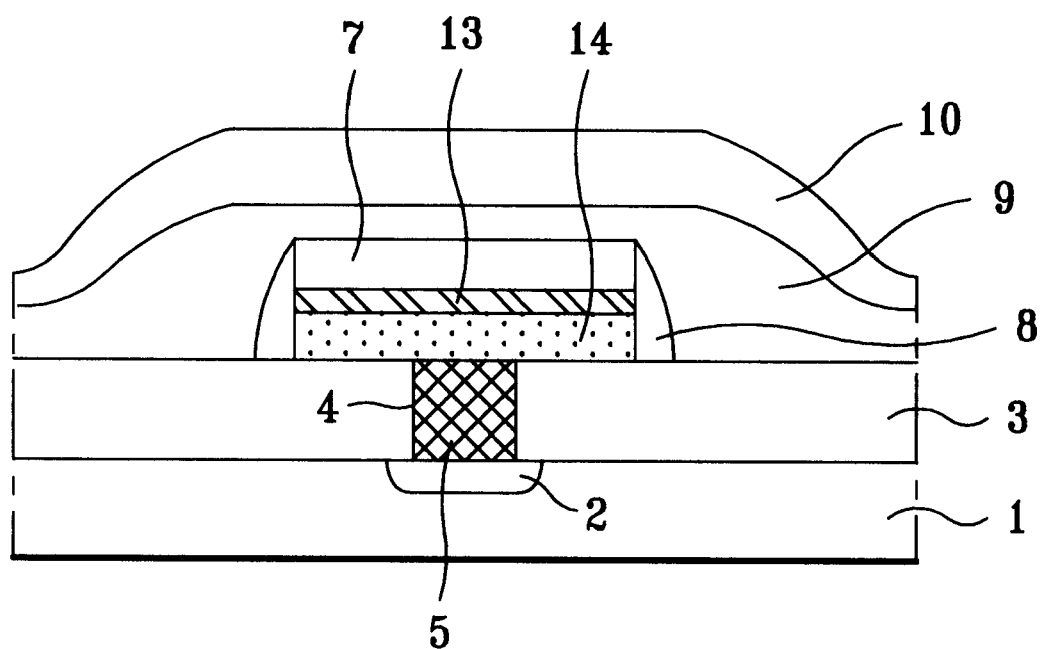
FIG. 5 is a cross-sectional view showing a structure of still another conventional capacitor in a semiconductor device.
Figure 6:
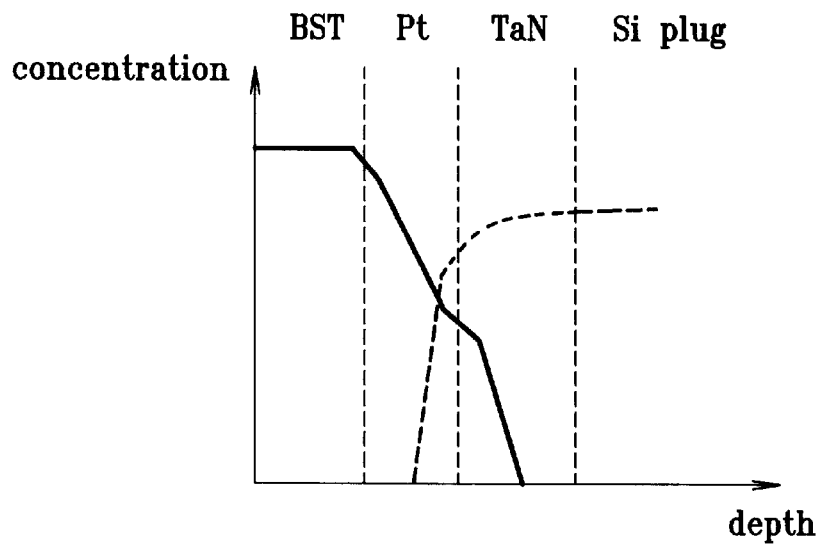
FIG. 6 is a profile diagram showing measurements of diffusion of oxygen atoms and silicon atoms by means of SIMS when a TaN layer is used as a barrier metal layer.
Figure 7:
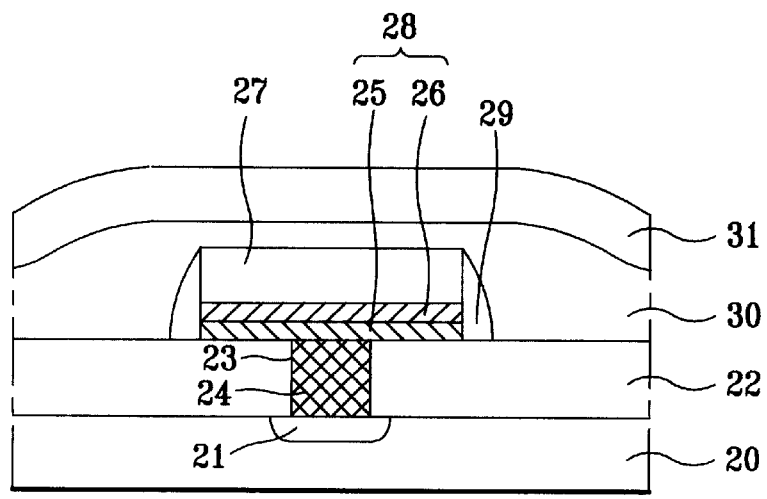
FIG. 7 is a cross-sectional view showing a structure of a capacitor in a semiconductor device according to a preferred embodiment of the invention.

FIG. 7 is a cross-sectional view showing a structure of a capacitor in a semiconductor device according to a preferred embodiment of the invention.

As shown in FIG. 7, the capacitor includes a semiconductor substrate 20, an insulating layer 22 having a contact hole 23 on the substrate 20, a conductive plug 24 formed in the contact hole 23, barrier metal layers 28 having a first barrier layer, i.e. a TiW layer 25 formed on the conductive plug 24 and the insulating layer 22 adjoining to the conductive plug 24 and a second barrier metal layer, i.e. a TaN layer 26, formed on the TiW layer 25, a lower electrode 27 formed on the barrier metal layers 28, a high dielectric layer 30 formed on the lower electrode 27, and an upper electrode 31 formed on the high dielectric layer 30. In this case, sidewall spacers 29 are further formed between the high dielectric layer 30 and both sides of the TiW layer 25 and the TaN layer 26 and the lower electrode 27.

The TiW layer 25 used as the first barrier metal layer acts as a silicon diffusion prevention layer and the TaN layer 26 acts as the second barrier metal layer and is an oxygen diffusion prevention layer. In another embodiment, a TiN layer may be used instead of the TaN layer 26. In other words, either a TaN layer or a TiN layer can be used as the oxygen diffusion prevention layer. The conductive plug 24 of the capacitor under the invention may be made of polysilicon. An impurity diffusion region 21 is formed in the semiconductor substrate 20 on which the plug 24 is formed. The high dielectric layer 30 is made, for example, of any one of PZT ($Pb(Zr,Ti)O_3$: lead zirconium titanium oxide), PLZT ($(Pb,Li)(Zr,Ti)O_3$: lead lithium zirconium titanium oxide), BST ($(Ba,Sr)TiO_3$: barium strontium titanium oxide), $BaTiO_3$ (barium titanium oxide), and STO ($SrTiO_3$: strontium titanium oxide). Both of the lower and upper electrodes 29 and 31 are made of platinum.

FIGS. 8a to 8d shows process steps of a manufacturing method of a capacitor in a semiconductor device under the invention.

Figure 8A:
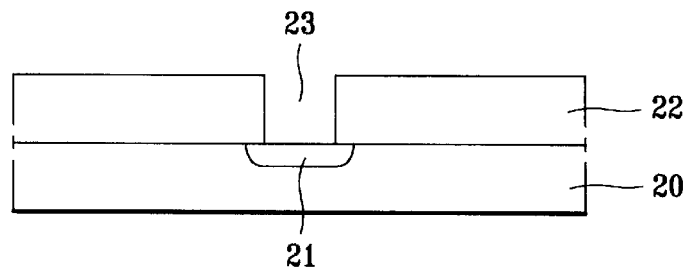
FIGS. 8a to 8d are cross-sectional views showing process steps of a method for manufacturing a capacitor in a semiconductor device according to a preferred embodiment of the invention.

Referring initially to FIG. 8a, an interfacial insulating layer 22 is formed on a semiconductor substrate 20 in which an impurity diffusion region 21 used as source/drain is formed, and then is selectively patterned (by photolithography and photo etching), so that a node contact hole 23 is formed on the impurity diffusion region 21.

Figure 8B:
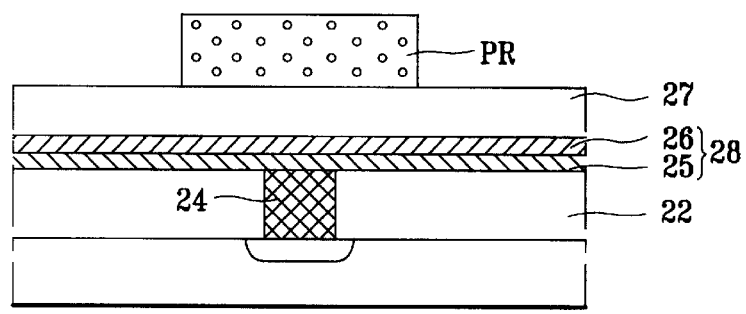

Next, a polysilicon is selectively formed in the node contact hole 23 so as to form a conductive plug 24, as shown in FIG. 8b. Then, a TiW layer 25, a TaN layer 26, a lower electrode 27, and a photoresist layer are successively formed on the conductive layer plug 24 and the interfacial insulating layer 22. Subsequently, by employing exposure and development, a storage node region is defined to pattern the photoresist layer. At this time, as a first barrier layer, the TiW layer 25 is an excellent diffusion prevention layer against silicon atoms. As a second barrier layer, the TaN layer 26 is an excellent diffusion prevention layer against oxygen atoms. The two previous explained layers are used as barrier metal layers 28. In this case, a TiN layer may be used instead of the TaN layer 26. That is to say, as barrier metal layers, the TiW layer 25 and the TaN layer 26 may be successively formed, or the TiW layer 25 and the TiN layer may be successively formed. The lower electrode 27 is made, for example, of Pt.

Figure 8C:
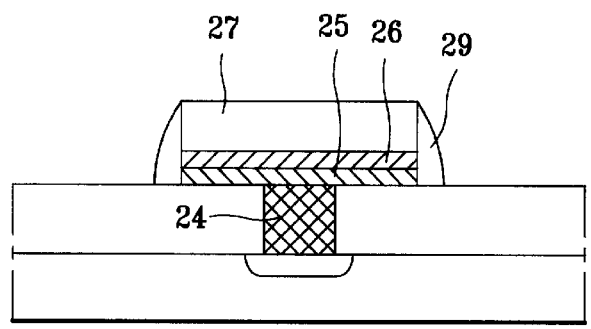
Figure 8D:
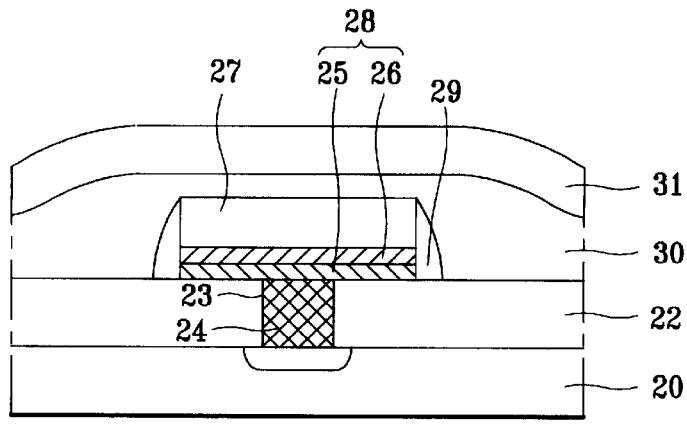

Thereafter, as shown in FIG. 8c, the lower electrode 27 and the barrier metal layers 28 are successively etched with the patterned photoresist layer serving as a mask, so that only the lower electrode 27 and the barrier metal layers 28 over the storage node region are left. Then the remaining photoresist layer is removed. Subsequently, an insulating layer is formed on the entire surface of the lower electrode 27 inclusive of the interlayer insulating layer 22 and then is etched by a reactive ion etch (RIE) process, thereby forming sidewall spacers 29 on both sides of the lower electrode 27 and the barrier metal layers 28. In this case, the sidewall spacers 29 are formed of either an oxide or a nitride.

Finally, on the surfaces of the lower electrode 27, the sidewall spacers 29, and the interlayer insulating layer 22, there is formed a high dielectric layer 30 on which an upper electrode 31 is formed. At this time, the high dielectric layer 30 is made, for example, of any one of PZT ($Pb(Zr,Ti)O_3$: lead zirconium titanium oxide), PLZT (($Pb,Li)(Zr,Ti)O_3$: lead lithium zirconium titanium oxide), BST (($Ba,Sr)TiO_3$: barium strontium titanium oxide), $BaTiO_3$ (barium titanium oxide), or STO ($SrTiO_3$: strontium titanium oxide). The upper electrode 31 is made, for example, of Pt.

Figure 9:
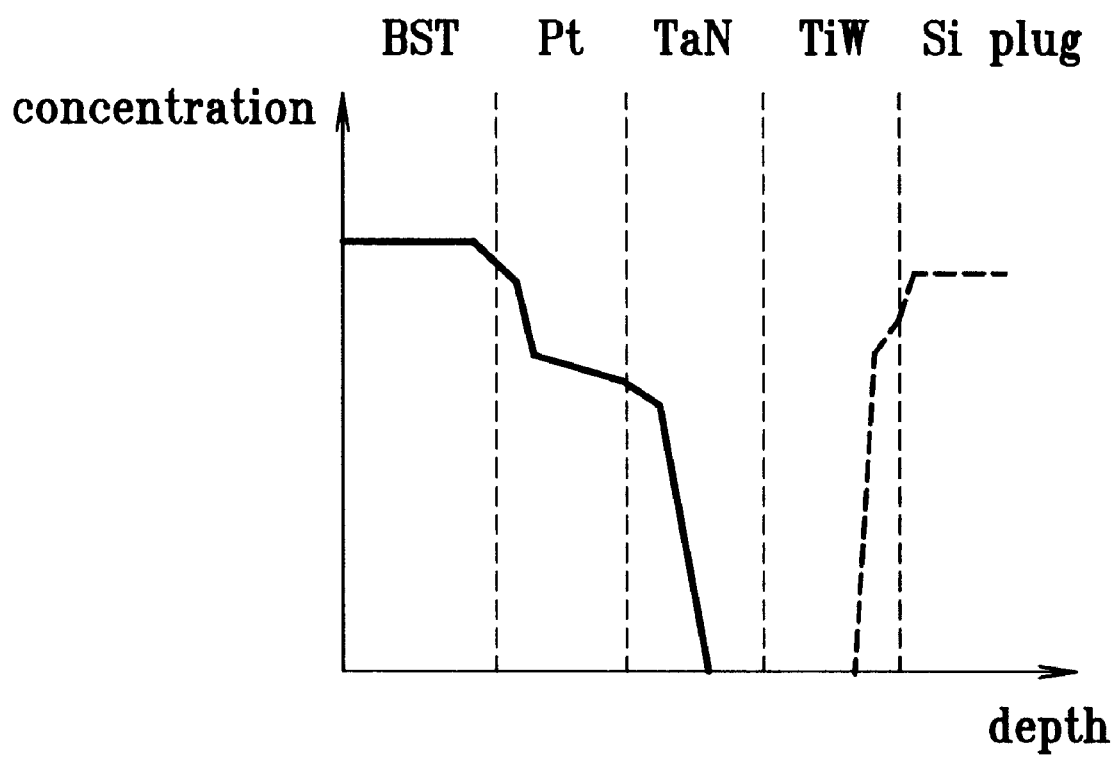
FIG. 9 is a profile diagram showing measurements of diffusion of oxygen atoms and silicon atoms by means of SIMS when TaN/TiW layers are used as barrier metal layers under the practice of the invention.

FIG. 9 is a profile diagram showing measurements of diffusion of oxygen atoms and silicon atoms by means of SIMS when TaN/TiW layers are used as barrier metal layers. It is evident that oxygen atoms crossing the grain boundary of the lower electrode 27 are prevented from diffusing through the TaN layer 26, and that silicon atoms contained in the polysilicon plug 24 are prevented from diffusing through the TiW layer 25.

A capacitor in a semiconductor device of the invention has the following advantages.

First, since a TiW layer which has excellent diffusion prevention properties against silicon atoms is formed on a polysilicon plug, and then either a TiN layer or a TaN layer which has excellent diffusion prevention properties against oxygen atoms is formed below a lower electrode, the generation of a silicon oxide ($SiO_2$) layer is prevented. As a result, the generation of an inherent resistance or leakage current is restricted. Accordingly, a capacitor having good reliability in a semiconductor device can be provided.

Second, since the TiW layer, which is relatively easily oxidized, is formed below the TaN layer, the oxygen atoms contained in the high dielectric layer cannot diffuse to the TiW layer, so that the formation of a $TiO_2$ layer at the interface of the lower electrode and the TiW layer is greatly restricted.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method for manufacturing a capacitor in a semiconductor device comprising the steps of:

forming an insulating layer on a semiconductor substrate and selectively etching the insulating layer so as to form a contact hole;

forming a conductive plug in the contact hole;

forming a first barrier layer on the conductive plug and a second barrier layer on the first barrier layer, wherein said first barrier layer is a silicon diffusion prevention layer, and said second barrier layer is an oxygen diffusion prevention layer;

forming a lower electrode on the second barrier layer;

forming a dielectric layer on the lower electrode; and forming an upper electrode on the dielectric layer.

2. The method of claim 1, wherein said silicon diffusion prevention layer is made of TiW.

3. The method of claim 1, wherein said oxygen diffusion prevention layer is made of either TaN or TiN.

4. The method of claim 1, wherein insulating sidewalls are further formed between (i) the dielectric layer and (ii) both sides of the first and second barrier layers and the lower electrode.

5. The method of claim 1, wherein said dielectric layer is made of any one of PZT ($Pb(Zr,Ti)O_3$: lead zirconium titanium oxide), PLZT (($Pb,Li)(Zr,Ti)O_3$: lead lithium zirconium titanium oxide), BST (($Ba,Sr)TiO_3$: barium strontium titanium oxide), $BaTiO_3$ (barium titanium oxide), and STO ($SrTiO_3$: strontium titanium oxide).

6. The method of claim 1, wherein said lower and upper electrodes are made of Pt.

7. The method of claim 1, wherein said conductive plug is made of silicon.

8. The method of claim 1, wherein an impurity diffusion region is further formed in the substrate on which the conductive plug is formed.

9. A method for manufacturing a capacitor in a semiconductor device comprising the steps of:

forming a first barrier layer on a substrate, wherein the first barrier layer is a silicon diffusion prevention layer;

forming a second barrier layer on the first barrier layer, wherein the second barrier layer is an oxygen diffusion prevention layer;

forming an electrode on the second barrier layer; and forming a dielectric layer on the electrode.

* * * * *